United States Patent [19]

Vella

[11] 4,328,920
[45] May 11, 1982

[54] PORTABLE ELECTRONICS REPAIR SYSTEM INCLUDING IMPROVED DESOLDERER FOR USE THEREWITH

[75] Inventor: Alexander J. Vella, Derwood, Md.

[73] Assignee: Pace Incorporated, Laurel, Md.

[21] Appl. No.: 130,018

[22] Filed: Mar. 13, 1980

Related U.S. Application Data

[62] Division of Ser. No. 24,050, Mar. 26, 1979, abandoned.

[51] Int. Cl.³ .............................................. B23K 3/02
[52] U.S. Cl. ...................................... 228/20; 219/230; 219/238; 219/240
[58] Field of Search ............... 219/230, 238, 239, 240, 219/236, 237, 241; 228/20, 51; 339/91

[56] References Cited

U.S. PATENT DOCUMENTS

| | | | |
|---|---|---|---|
| 1,819,671 | 8/1931 | Buccola | 219/230 X |
| 2,826,667 | 3/1958 | Brillinger | 219/230 X |
| 3,003,049 | 10/1961 | Thomas | 219/230 X |
| 3,163,145 | 12/1964 | Duhaime et al. | 228/20 |
| 3,259,293 | 7/1966 | Dezzani | 228/20 |
| 3,392,897 | 7/1968 | Siegel | 228/20 |
| 3,842,240 | 10/1974 | Wakita et al. | 219/230 |
| 3,970,234 | 7/1976 | Litt et al. | 228/20 |
| 4,117,967 | 10/1978 | Regelson et al. | 228/20 |
| 4,225,076 | 9/1980 | Litt et al. | 228/20 |

OTHER PUBLICATIONS

Manko, *Solders and Soldering*, McGraw-Hill, N.Y. 1964, pp. 228-243.

*Primary Examiner*—Gil Weidenfeld
*Assistant Examiner*—K. J. Ramsey
*Attorney, Agent, or Firm*—Gerald J. Ferguson, Jr.; Joseph J. Baker

[57] ABSTRACT

A portable electronics repair system including a portable container, a motor disposed within the container, an air/vacuum pump disposed within the container and driven by the motor, an electrical power source removably connected to the container for driving the motor, and a desolderer removably connected to the air/vacuum pump, the desolderer including an electrical heater assembly energized by the electrical power source.

The desolderer includes a high heat, low energy consumption heater assembly and desoldering tip combination which facilitates rapid heating of the tip to soldering melting temperatures. An improved heater assembly is also provided which may be removably connected to the desolderer handle. The solder collector tube may be disposed within the desolderer handle and mounted with respect to an outer sleeve of the heater assembly. Means are provided for connecting the heating wire to the space outside the solder collector tube. Means are also provided for removably connecting the desoldering tip within the heater assembly. A removably rear housing including flexible gripping members is mounted at the rear of the desolderer handle.

48 Claims, 18 Drawing Figures

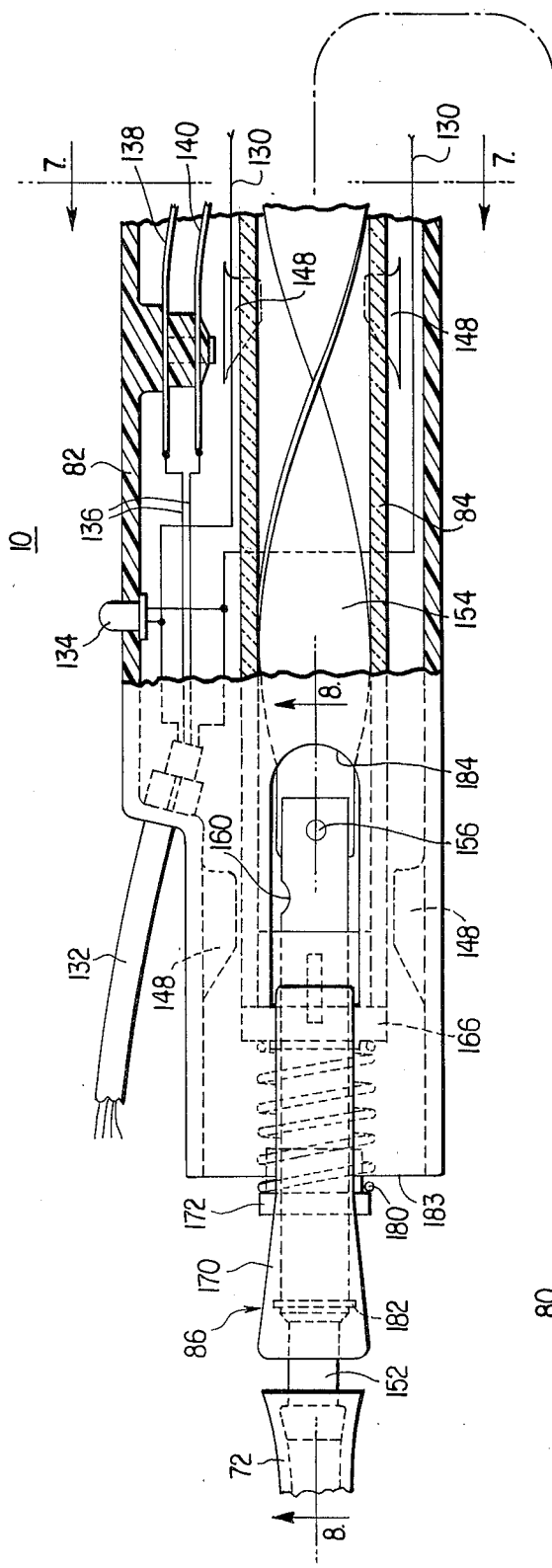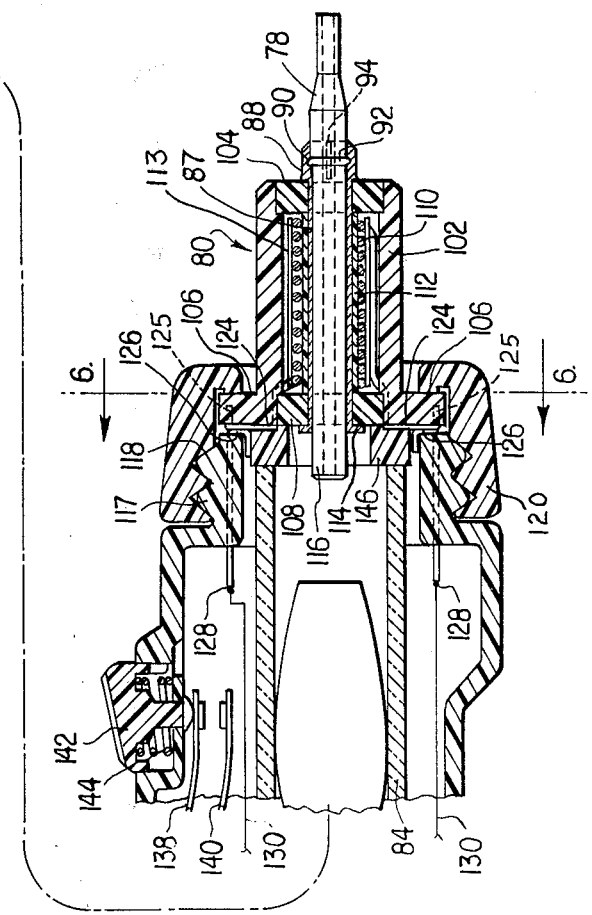

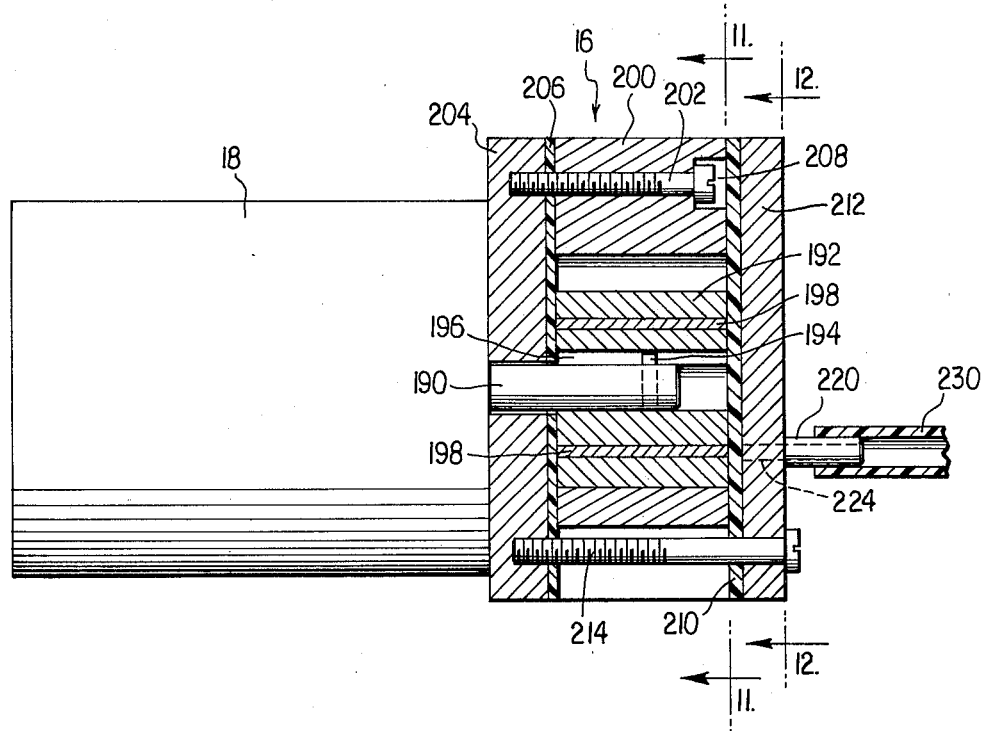
FIG. 10
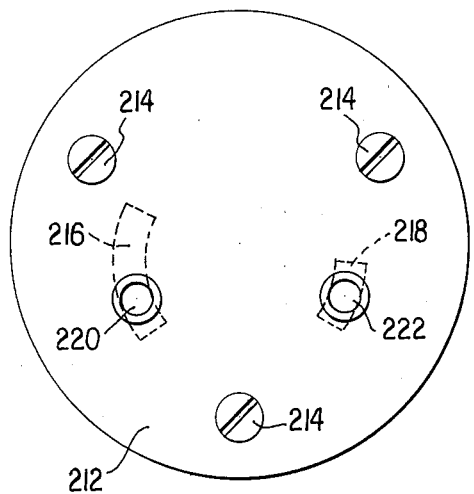
FIG. 12
FIG. 11

PORTABLE ELECTRONICS REPAIR SYSTEM INCLUDING IMPROVED DESOLDERER FOR USE THEREWITH

RELATED APPLICATION

This application is a division of U.S. application Ser. No. 24, 050 filed Mar. 26, 1979, now abandoned.

BACKGROUND OF THE INVENTION

1. Field of the Invention

This invention relates to portable systems for repairing electronic circuitry including printed circuits and the like and to desolderers for use in such systems and other similar systems.

2. Discussion of the Prior Art

There are presently various repair systems on the market for the repair of electronic systems. These range the gamut from a simple soldering iron permitting soldering of components to complex systems allowing desoldering, thermal stripping, resist soldering and desoldering, thermal parting, reflow soldering, conductive tweeze heating systems, chemical plating, as well as minature machining systems for abrading, milling, drilling, etc.

These total systems typically are made up in a modular package, consisting of a power source, motor, vacuum pump, heating elements for soldering, desoldering, as well as conductive and resistive heating devices and transformers to either transform the mains voltage to a working voltage for high current and low voltage application, as well as rectification to direct current in the case of chemical plating operations. Typically, these repair systems weigh as little as 13 lbs. (without tools) and weigh as much as 40 lbs. or more for the larger systems. They all have certain basic limitations: (a) heavy weight; (b) they require line voltage; (c) they cannot be readily carried; (d) they cannot be readily used in installations where line voltage is not available; (e) they use large amounts of energy; (f) their cost is relatively high, thus precluding their use by a wide range of service technicians, such as T.V. repairmen, telephone linemen, etc.; and (g) they pose certain potential hazards to both personnel operating the same, as well as to the devices worked upon, because of the high voltages used during operation.

Within recent years there have been various devices on the market which provide a vacuum source without a vacuum pump by means of Venturi systems and the use of compressed air, either through shop air or compressed air cylinders or cartridges. While this eliminates the need for line voltage, it does not address the problem of providing electrical energy for the various resistive or inductive devices required for the repair of electronic systems.

In the past, some work has been done to provide low voltage devices. For example, there are battery-operated soldering irons, as well as low voltage operated vacuum pumps, and low voltage AC and DC motors. However, all of these battery-operated devices have very limited operating life. While recharge capability usually exists, it again requires line voltage via a charger. Most of these battery-operated devices operate on either 1.2 or 2.4 volts, thereby precluding their use for those applications where a 12 VDC system might be readily available, e.g., mobile repair trucks, cigarette lighter outlet on most automobiles and trucks. Similarly, these devices typically have one, two or more batteries mounted within. This often results in a rather unwieldy apparatus, which is relatively heavy, resulting in an awkward tip to grip ratio, making precise handling of the tool very difficult.

SUMMARY OF THE INVENTION

It is thus a primary object of this invention to provide a portable electronics repair system having an improved desolderer.

It is a further object of this invention to provide an improved desolderer having one or more of the following features: (a) optimized tip to grip ratio, (b) a quick connect, removable solder and solder collecting chamber and sealing system, (c) a high heat, low energy consumption heater assembly and desoldering tip combination, (d) an improved removable tip, and (e) improved means for connecting the heater wires to the space outside the solder collecting chamber when the chamber is mounted with respect to an outer sleeve of the heater assembly.

Other objects and advantages of this invention will be apparent from a reading of the following specification and claims taken with the drawing.

BRIEF DESCRIPTION OF THE DRAWING

FIG. 3 is a partial cross-sectional view of an illustrative desolderer hand-piece for use in the system of FIG. 1.

FIG. 4 is a perspective view of a desoldering tip for use with the desolderer of FIG. 3.

FIG. 5 is a cross-sectional view of a modified desoldering tip for use with the desolderer of FIG. 3.

FIG. 10 is a cross-sectional view of an illustrative air/vacuum pump for use in the system of FIG. 1.

FIGS. 11 and 12 are respective cross-sectional views taken on the lines 11—11 and 12—12 of FIG. 10.

DETAILED DESCRIPTION OF THE PREFERRED EMBODIMENTS OF THE INVENTION

Figure 1:
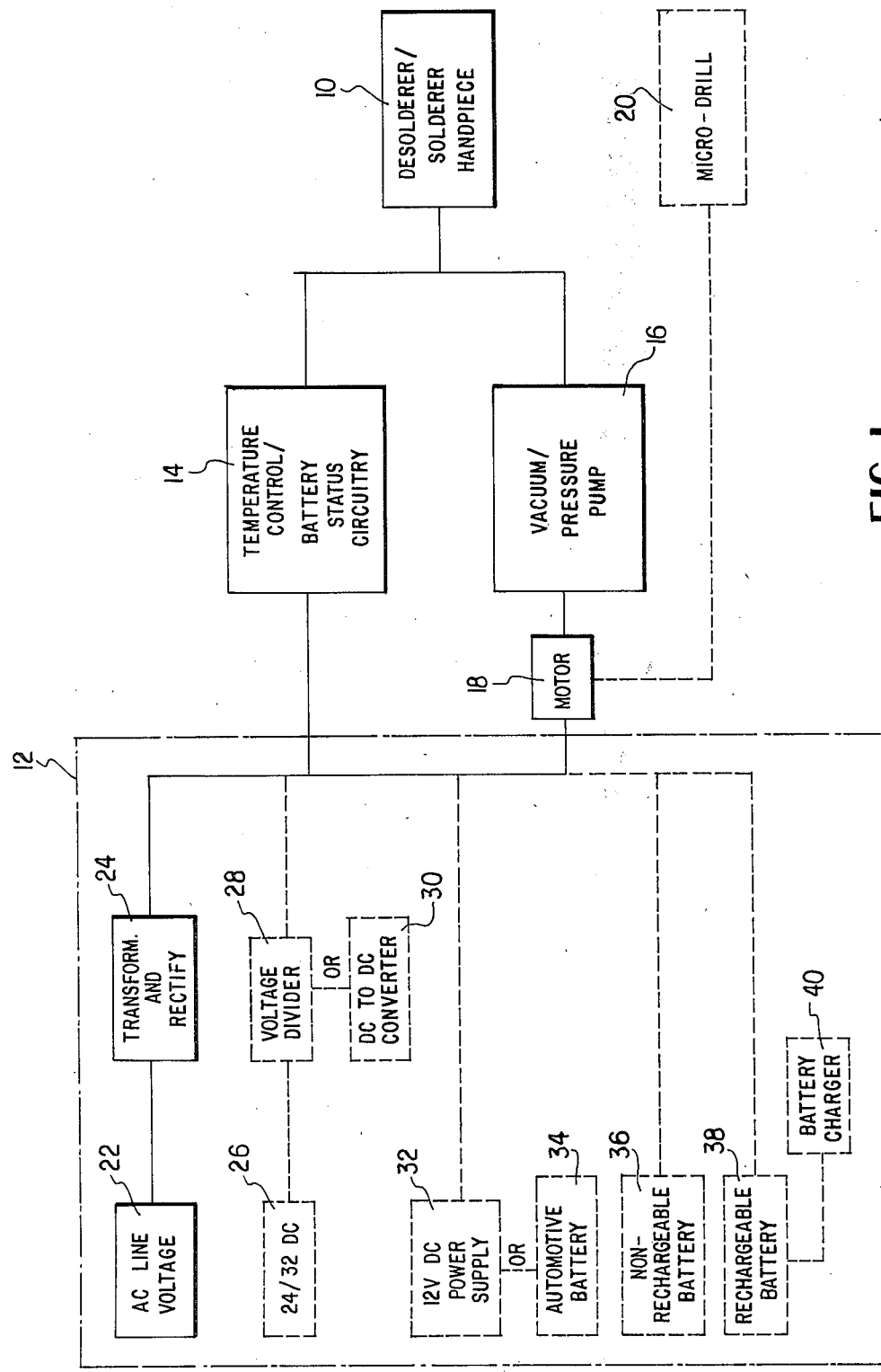
FIG. 1 is a block diagram of an illustrative portable electronics repair system in accordance with the invention.

Referring to FIG. 1, there is shown an illustrative portable electronics repair system in accordance with the invention whereby a desolderer/solderer 10, which will hereinafter be referred to as a desolderer, or the like is connected to a power source 12 via temperature control/battery status circuitry 14 and to a vacuum/pressure pump 16, which is driven by a motor 18. Motor 18 may also drive other optional devices such as a microdrill 20 via a double ended shaft or another motor might be employed for this purpose. Power source 12 is preferably a 12 volt source, which may be derived from (a) alternating line current voltage 22 which is transformed and rectified to 12 volts by transformer/rectifier 24, (b) a 24/32 volt DC source 26, the output of which is applied either to a voltage divider 28 or a DC to DC converter 30 to obtain the 12 volts, (c) a 12 volt DC power supply 32 such as an automobile battery 34. (d) a non-rechargeable battery 36 or (e) a rechargeable battery 38 having an associated battery charger 40 where battery 38 is preferably a lead acid sealed battery or a plurality of such batteries connected in series.

Figure 2:
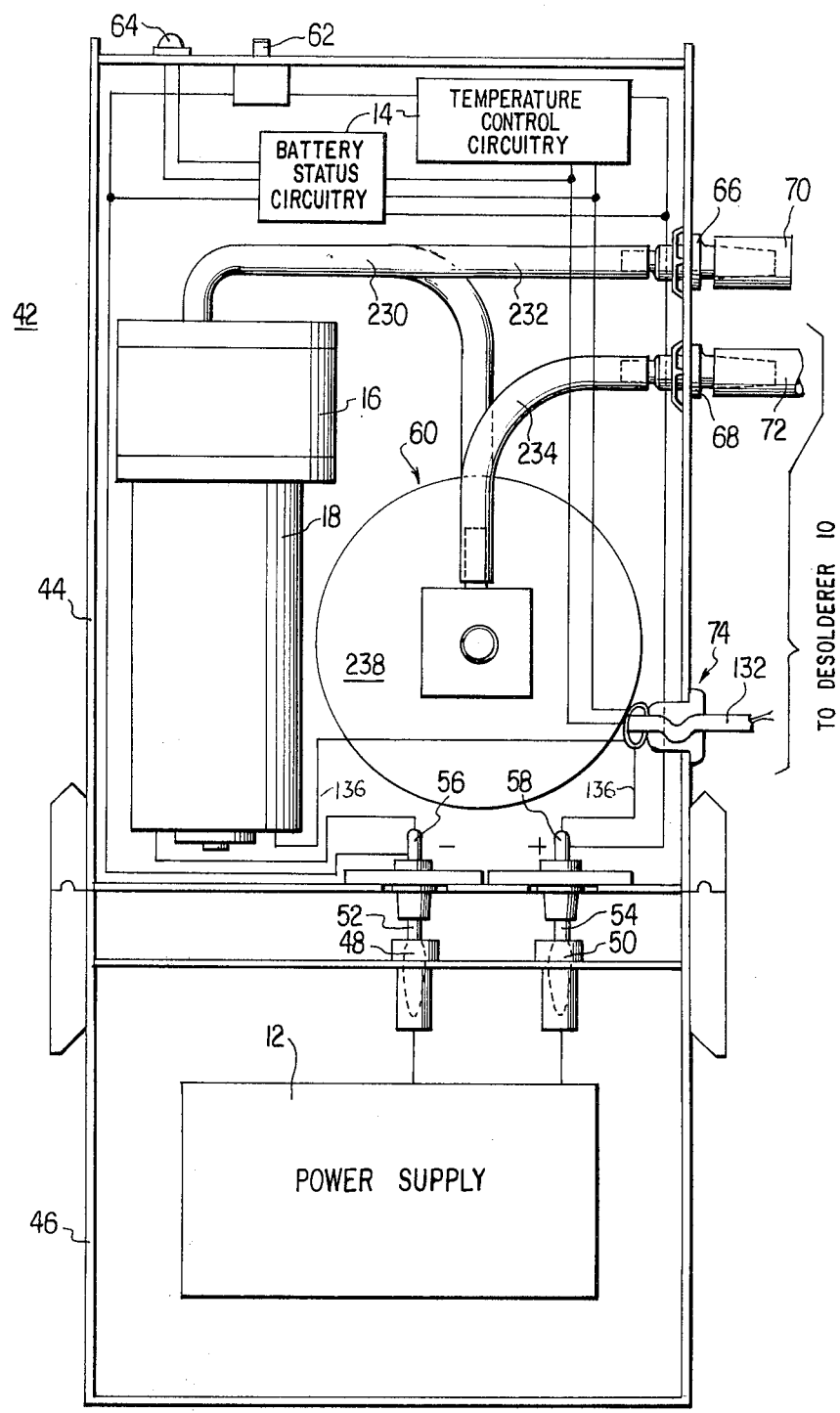
FIGS. 2 and 2A are respective plan and front views of an illustrative portable repair pack for use in the system of FIG. 1.
Figure 2A:
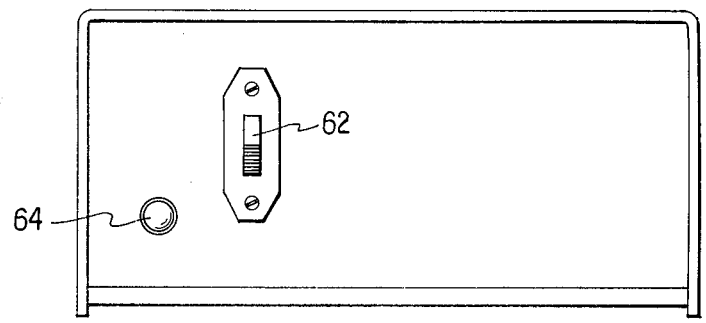

Referring to FIGS. 2 and 2A, there are shown respective plan and front views of an illustrative portable repair pack generally indicated at 42. The pack preferably comprises two containers 44 and 46 which are removably connected to one another by appropriate means. Disposed within container 46 is power supply 12. Jacks 48 and 50 are provided at one end of container 46. Pins 52 and 54 removably engage the jacks so that the desired 12 volts appears across terminals 56 and 58 where the terminals are disposed at one end of container 44. Also disposed within container 44 is motor 18, pump 16, temperature control/battery status circuit 14 together with a filter generally indicated at 60. A switch 62 for energizing circuitry 14 is provided on the forward wall of container 44 as is an LED 64 which provides an indication of the battery status. Connections 66 and 68 are provided on a side wall of container 44 whereby either vacuum (via connector 68) or pressure (via connector 66) may be applied to desolderer 10. The normal mode of operation is vacuum. Thus, a porous muffler 70 may be provided on connector 66. A hose 72 is normally connected to connector 68 and thence to desolderer 10. When air under pressure is to be applied to the desolderer, the positions of muffler 70 and hose 72 are reversed.

Electrical connections to the desolderer pass through a restrainer 74 disposed in a wall of container 44. Thus, it can be seen repair pack 42 contains a number of components necessary for a sophisticated repair system, yet the size and packaging of these components is such that the pack is readily portable. The interconnection of these components within the pack will be described in more detail hereinafter.

Referring to FIG. 3, there is shown in partial cross-section an illustrative desolderer 10 for use with the portable electronics repair system of the present invention. Generally, the desolderer includes a tip 78, a heater assembly 80, a handle 82, a solder collection chamber 84 disposed within the handle, and a spring loaded rear housing 86.

The heater assembly 80 includes a bobbin 87 which preferably integrally incorporates at the forward end thereof a sleeve 88 although the sleeve need not necessarily be integrally connected to the bobbin. Sleeve 88 preferably has a groove 90 provided in the inner surface thereof. Replaceable tubular tip 78 may have a ring 92 disposed about the periphery thereof so that ring 92 may be normally removably disposed within groove 90 to thereby hold tip 78 in place with respect to heater assembly 80. As can be seen in FIGS. 3 and 4, sleeve 88 is preferably provided with three equally spaced slots 94 which permit the sleeve to expand as ring 92 is inserted into the sleeve. Thus, the tip 78 may be readily removed from heater assembly 80. Further, ring 92 may assist in the sealing of vacuum.

In FIG. 5, an alternative arrangement for mounting tip 78 with respect to heater assembly 80 is illustrated wherein sleeve 88 is provided with an internally threaded hold 96 and a set screw 98 which holds the tip 78 in place. Further, sleeve 88 may be counterbored as indicated at 100 to receive ring 92 of tip 78. Hence, the ring 92 serves both to position the tip with respect to the heater assembly and also to act as a vacuum seal. In order to mount ring 92 on tip 78, a circumferential groove 93 may be formed on the tip and a metal music wire ring or the like may be inserted within the groove.

Figure 6:
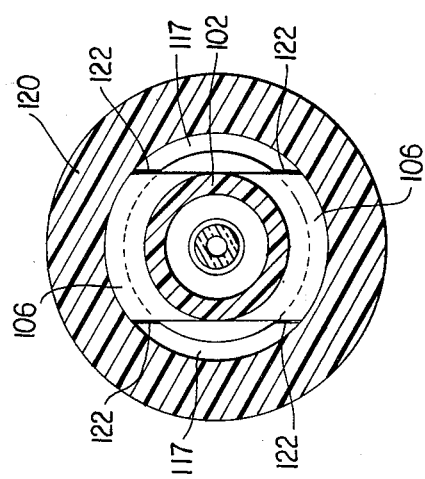

The heater assembly further includes a preferably insulating, outer cylindrical sleeve 102 which is preferably made of a plastic, heat insulating material such as that sold under the trademark Vespel by Dupont Co. As can be seen in FIGS. 3 and 6, a rectangular flange 106 is provided at the rearward end of sleeve 102. Annular front and rear spacers 104 and 108 are provided between sleeve 102 and bobbin 87, these spacers preferably being made of heat insulating material such as ceramic. Disposed within sleeve 102 is heating wire or element 110 which preferably comprises an alloyed material such as nickel-iron which has a relatively large coefficient of resistance as will be explained in more detail hereinafter with respect to FIG. 16. From the foregoing, it can be seen that sleeve 102, bobbin 87 and spacers 104 and 108 advantageously define an enclosed space for heating wire 110 where the spacer may be radial struts but which preferably are ring-like to completely enclose the heating wire space.

The heating wire is preferably wound about bobbin 87, the bobbin preferably comprising a low mass, heat conductive, corrosion resistant material such as that sold under the trademark EverDur. Disposed between the bobbin and heating wire 110 is a layer of electrical insulating material such as mica, the layer being indicated at 112. Also preferably disposed over the heating wire is a layer 113 of insulating material, which lessens the amount of outwardly radiated heat.

The tip 78 thus preferably extends completely through the bobbin 87, the tip illustratively comprising nickel plated copper. The heat capacities (or masses) of the bobbin and tip are such that the entire tip 78 may be quickly brought up to temperature due to the relatively low combined mass of the bobbin and tip. Preferably, the time required to heat the entire tip to a solder melting temperature is less than 90 seconds although it may be as much as five minutes and is typically more than 30 seconds although it may be less. Hence, the desolderer is particularly well suited for portable applications.

The heat capacities (or masses) of the bobbin and tip are in large part reduced because of the low heat capacity (or mass) of the bobbin compared to the heat capacity (or mass) of prior art bobbins such as that disclosed in U.S. Pat. No. 3,392,897 granted to William J. Siegel, which is incorporated herein by reference. The desolderer described in this patent is suitable for many applications. However, where portability of repair equipment is desirable, the desoldering tip should preferably be quickly raised to the required desoldering temperature. However, the available power supply may be relatively small (a 12 volt battery, for example) so that the temperature can not be quickly raised by power alone. Also, there are other considerations which preclude the use of power alone to quickly raise the tip temperature. In any event, the efficiency of the desolderer in converting electrical energy to heat should also be improved to permit the more efficient utilization of a smaller power supply.

Thus, for the above reasons, it is desirable that the ratio of the heat capacities (or masses) of bobbin 87 and tip 78 be substantially less than that employed in U.S. Pat. No. 3,392,897. Generally, the heat capacity (or mass) of the bobbin should not be more than approximately twice that of the tip.

The rearward portion of bobbin 87 is preferably outwardly bent as indicated at 114 to thereby mechanically hold the heater assembly together and to also assist in the sealing of the vacuum.

The forward end 117 of handle 82 is externally threaded at 118. An internally threaded cap 120 is threaded onto threads 118 to removably secure the flange 106 of heater assembly 80 to handle 82. Thus, due to the removable connection of the heater assembly to the handle, the heater assembly can be readily removed for repair or replacement. The forward end 117 of handle 82 is rectangularly slotted at 122 as indicated in FIG. 6 to receive the rectangular flange 106 of heater assembly 80 in mating engagement. Hence, the heater assembly is non-rotatably mounted with respect to the handle 82.

The opposite ends of heating wire 110 are connected to flat electrical contacts 124 (typically nickel), which may pass between flanges 106 and spacer 108, there preferably being provided channels on the inner surfaces of the flanges to facilitate the passage of the contacts between the flanges and the spacer. The contacts 124 are then bent against the rear faces of flanges 124 and finally are bent once again into holes 125 in the rear faces to secure them in place.

Contacts 124 engage contacts 126 (beryllium, for example) provided at the forward end of handle 82, which contacts may be J-shaped to provide some springiness and thus intimate contact with contacts 124. The forward end 117 of the handle may be provided with slots into which contacts 126 may be inserted and held in place, the contacts 126 terminating at 128.

The forward end of solder collection chamber 84 is pressed against a flexible seal 146 disposed within forward end 117 of the handle. The seal 146 intimately fits over contacts 124 to provide an hermetic seal at the points where the contacts pass to the space outside solder collection chamber 84. In this connection, it should be noted the forward end of solder collection chamber 84 is effectively connected to sleeve 102 via seal 146 and flange 106. Hence, the foregoing arrangement provides a novel and advantageous technique for connecting the heater wires to the space outside chamber 84 when the chamber is mounted with respect to a sleeve (sleeve 102) which contains the heater wires. Hence, thermal isolation of seal 146 from tip 78 is enhanced thereby promoting seal performance and longevity. Also, by moving annular rear spacer 108 to the right in FIG. 3, the thermal isolation of the seal can be further enhanced.

It should also be noted with respect to seal 146 that not only does one side thereof seal the connection of the heater wires to the outside of chamber 84, but the other side thereof seals the forward end of the chamber. Hence, the seal is doubly effective in maintaining the requisite vacuum space within the desolderer.

Wires 130 are connected to points 128, the wires passing through a cable 132 back to portable power pack 42 of FIG. 2. A light emitting diode 134 mounted on handle 82 is connected across wires 130, the purpose of which is to indicate to the operator that the desolderer is ready for use as will be described in more detail hereinafter with respect to FIG. 16.

Figure 7:
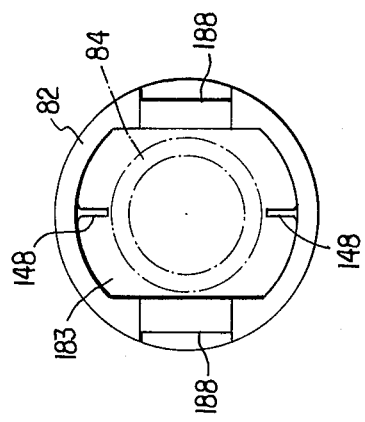
FIGS. 6-8 are respective cross-sectional views on the lines 6—6, 7—7 and 8—8 of FIG. 3.

Also extending through cable 132 are wires 136 which engage flexible contact 138 and contact 140, as can be seen in FIG. 3. A push button 142 engages flexible contact 138 and is normally outwardly biased by a spring 144. Upon depression of spring 142, contacts 138 and 140 are closed to apply vacuum or pressure to the desolderer as indicated in FIG. 2. As can be seen in FIGS. 3 and 7, a plurality of ribs 148 depending from the inner surface of handle 82 center and support solder collection chamber 84. As can also be seen in FIG. 7, handle 82 is provided with a hollow ridge 150 which provides for the mounting of LED 134, switch 142, contacts 138 and 140 and which provides a passageway for wires 130 and 136.

Figure 9:
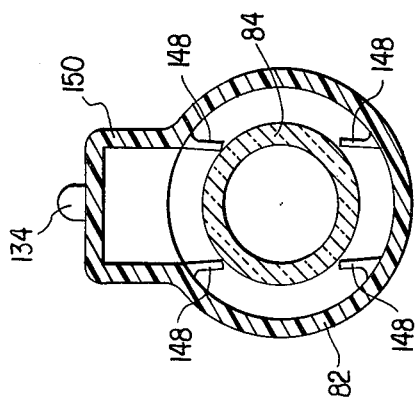
FIG. 9 is an end view of the desolderer of FIG. 3.

As stated above, collection chamber 84 is pressed against forward seal 146. This is effected by a spring loaded rear housing 86, as can best be seen in FIGS. 3, 8 and 9. This housing comprises an air/vacuum tube 152, the rearward end of which has hose 72 disposed thereover and the forward end of which has a helical baffle 154 connected thereto by means of a set screw 156. A hole 158 extends through the tube from hose 72 to an opening 160 extending through the side of the tube. Thus, an air/vacuum path is established from the interior of chamber 84 to hose 72. Tube 152 is mounted with respect to chamber 84 via a cup-shaped seal 162 having a forward portion 164 which extends into chamber 84 to provide an air-tight seal and an enlarged rear portion 166 which fits over the end of chamber 84. A ring 168 may be provided on the outer circumference of tube 152 to position the tube with respect to seal 162.

Slidably disposed on tube 152 is a detenting pinch lock 170, the purpose of which is to hold chamber 84 in place within handle 82 in a press fit against forward seal 146. The lock 170 is generally H-shaped and includes a cylindrical bearing hub 172 which is slidably disposed on tube 152. Extending from hub 172 are a pair of flexible support arms 174 which support a pair of flexible, gripping fingers 176. The forward ends of fingers 176 are provided with detents 178. A compression spring 180 is mounted around tube 152 between the rearward portion 166 of seal 162 and arms 174 of lock 170. Thus, the lock is normally biased away from the rearward end of chamber 84. A ring 182 mounted on tube 152 limits the rearward movement of lock 170.

In order to provide a gripping surface for detents 178 of lock 170, a pair of openings 184 are provided in the sides of handle 82. The rear edge 186 of these openings provides the requisite gripping surface. Also, as can best be seen in FIGS. 8 and 9, a pair of lands 188 are provided on the rearward surface of handle 82 to provide a pair of recesses upon which the fingers 176 may be mounted.

Figure 8:
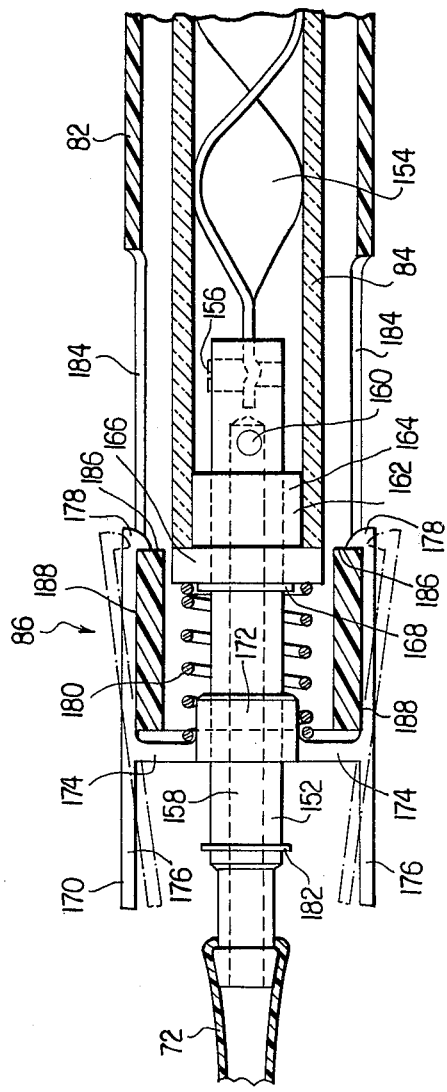

When the spring loaded rear housing 86 is in the position shown in FIGS. 3 and 8, the solder collection chamber 84 is locked into position within the handle 82 and is ready for operation. Assuming the heater has been energized, the operator need only press button 142 whereby vacuum may be applied to tip 78 to withdraw molten solder through tip 78 into solder collection chamber 84 where it splatters against helical baffle 154. Due to the helical shape of the baffle and due to the placement of vacuum port 156 on the side of tube 152, there is little, if any, probability of the molten solder entering the port. After a number of operations, it will become necessary to clean chamber 84 of the molten solder collected therein. This is simply effected by pinching the fingers 176 of lock 170 to the dotted line positions shown in FIG. 8. Once the detents 178 are removed from edges 186 of openings 184, spring 180 will push lock 170 back to stop 182. Thus, the entire assembly including spring loaded rear housing 86 and solder collection chamber 84 may be removed from the open rearward end of handle 82. Once this is done, the seal 162 may be removed from chamber 84 thereby removing the entire rear housing 86 from the chamber. As the housing is removed from the chamber, it may be rotated by the operator to thereby scrape the inner surface of chamber 84 with the edges of the helical baffle 154 and thus scrape the surface clean of any solder solidified thereon. To expedite this, the radial extend of the baffle 154 substantially corresponds to that of the inside diameter of collection chamber 84 as can be seen in FIGS. 3 and 8.

Once the chamber has been cleaned, it can again be mounted on the forward portion 164 of seal 162. The entire assembly is then inserted into the handle with the lock 170 being pinched to its dotted position as shown in FIG. 8. The assembly including rear housing 86 and chamber 84 is then pressed against spring 180 until detents 178 can be detented over the edges 186. At this time the lock 170 is released to thereby once again lock the collection chamber 84 in place within handle 82 and press fit the forward end of the chamber against forward seal 146 and thus, effect an air-tight seal at this end of the chamber. It should be noted from the above that rear housing 86 is advantageously moved straight in and out when it is attached and disconnected from the handle. Further, in FIG. 9 ribs 148 are also provided at the rearward end of handle 82 to provide additional centering support for the chamber within the handle. Also the rearward end of handle 82 is open as indicated at 183 in FIGS. 3 and 9 to provide air venting through opening 183 and side openings 184 to thereby promote heat dissipation from solder collection chamber 84.

Referring now to FIGS. 10–12, there is shown an illustrative vacuum pump in accordance with the invention. Motor 18 for driving pump 16 is commercially available, it typically being a 12 volt DC motor which is available, for example, from the Pittman Company, Harleysville, Penna. The drive shaft 190 has mounted thereon a rotor 192, the shaft being provided with a key 194 which engages a slot 196 within the rotor. The rotor can be powdered metal or extruded or molded plastic. Provided within the rotor are four slots which slidably receive four vanes 198. The vanes may be made from a lower cost phenolic or carbon. A rotor housing 200 is eccentrically mounted with respect to rotor 192, the housing being mounted via screws 202 to a plate 204 non-rotatably mounted onto motor 18. A rotor end plate 206 is disposed between the housing 200 and plates 204. Recesses 208 are provided in housing 200 so that the heads of screws 202 are recessed within the housing. A further rotor end plate 210 is disposed between housing 200 and a plate 212. Plate 212 is secured to plate 204 via screws 214 to thereby hold the pump together.

As can be seen in FIG. 11, the inner surface of housing 200 is provided with an elongated indentation 216 at the edge thereof adjacent end plate 210. Further, the inner surface is also provided with a further indentation 218 which is also adjacent the end plate 210. Thus, when the rotor is rotated in the clockwise direction in FIG. 11, the sliding vanes 198 will assume the illustrated positions and will create a vacuum at indentation 216 and air under pressure at indentation 218. As can be seen in FIGS. 11 and 12, a pair of tubes 220 and 222 are mounted on plate 212 and are in alignment with holes 224 which extend through plate 212. Further, these holes are in alignment with indentations 216 and 218 of the rotor. Hence, vacuum is provided at port 220 and air under pressure at port 222.

The vacuum/pressure pump of FIGS. 10–12 in combination with motor 18 has a number of operational and structural advantages. Operationally, the pump is run at a speed much higher than would be normally required to generate the vacuum needed by desolderer 10. In particular, it is typically run at 8,000 RPM. By running the pump at this high speed, it is possible to generate the requisite vacuum in spite of the small size of the pump—that is, typically 1½ inches or less in diameter and 1½ inches or less in length. Further, by running the pump at a high speed, it is not necessary to accurately fabricate the pump components to close tolerances. This, in turn, results in a very economical pump and thereby lessens the overall cost of the portable repair system of this invention. Thus, in fabricating the pump, costly and time-consuming rotor shimming operations are eliminated. Further, the rotor, rotor housing and vanes can be finished ground in one pass. Also to further reduce assembly time and facilitate field service without special tools, the rotor and vanes are self-centered and self-sealed. To compensate for any tendency of housing 200 to heat as the pump is driven at the high speed, housing 200 is preferably provided with a plurality of circumferentially disposed fins 201, which may be formed during the extrusion of the housing.

As can be seen in FIGS. 2 and 10, hoses 230 and 232 are respectively connected to vacuum and pressure tubes 220 and 222 where hose 232 is connected to connector 66 and hose 230 is connected to one side of filter 60. A hose 234 is connected to the other side of filter 60 and at its other end to connector 68.

Figure 13:
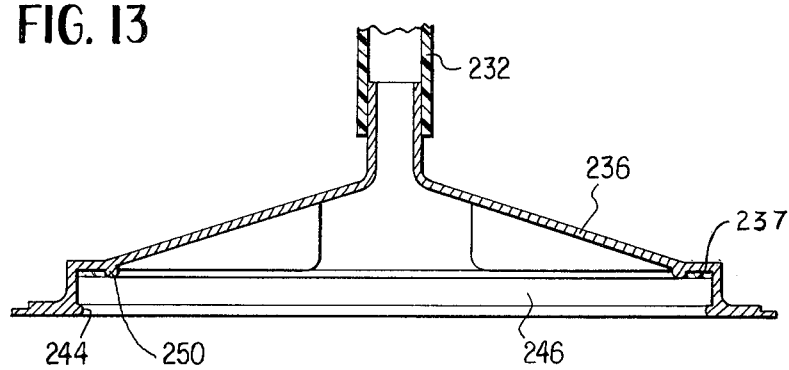
FIGS. 13 and 14 are cross-sectional views of illustrative filter holding members for use with the system of FIG. 1.
Figure 14:
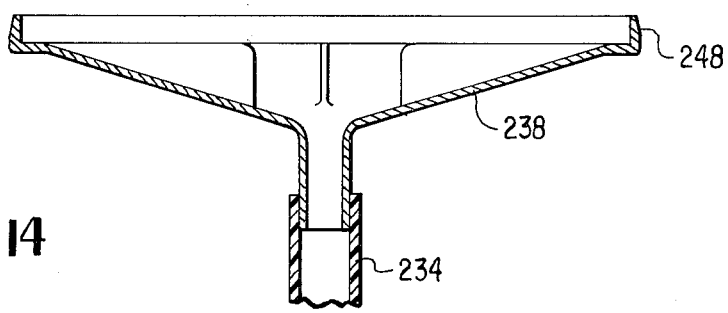
Figure 15:
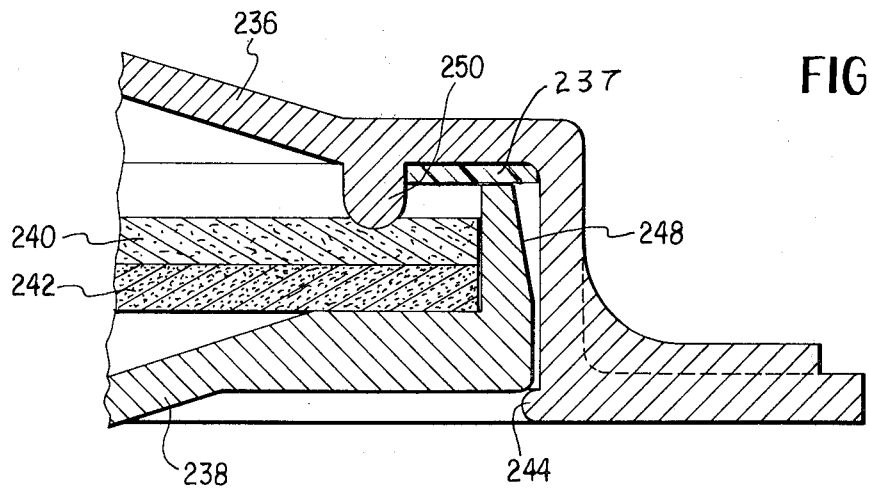
FIG. 15 is a cross-sectional view illustrating members of FIGS. 13 and 14 when assembled.

Referring to FIGS. 13–15, an illustrative filter 60 is shown. As can be seen in FIG. 13, hose 232 is connected to a first cup-shaped member 236 comprising a first part of filter 60 and as can be seen in FIG. 14, hose 234 is connected to a second cup-shaped member 238. As can be seen in FIG. 15, cup-shaped member 238 is adapted to receive at least one porous filter 240 and a further filter 242 if desired. Further, member 236 is adapted to receive a gasket 237 and member 238 after the latter member has been loaded with filter material. Both members 236 and 238 are made of flexible material to facilitate the engagement of member 238 by member 236. As can be seen in FIGS. 13 and 15, member 236 is provided with a circumferential ridge 244 at the lower opening 246 thereof which holds member 238 in place after it has been inserted within member 236. To facilitate the engagement of member 238 by member 236, member 238 is also provided with an inwardly slanted outer peripheral wall 248.

To retain the filters 240 and 242 in place, member 236 is provided with a further circumferential ridge 250 which is so disposed as to engage the filters and hold them in place as indicated in FIG. 15. The flexible material of which the members 236 and 238 are made is preferably a transparent plastic whereby the condition of filters 240 and 242 can be readily observed, as indicated in FIG. 2, to thereby ensure filter replacement when necessary. Due to the two-piece construction of the filter container 60, member 238 can be readily snapped from member 236, new filters inserted, and snapped back together in an expeditious manner.

Figure 16:
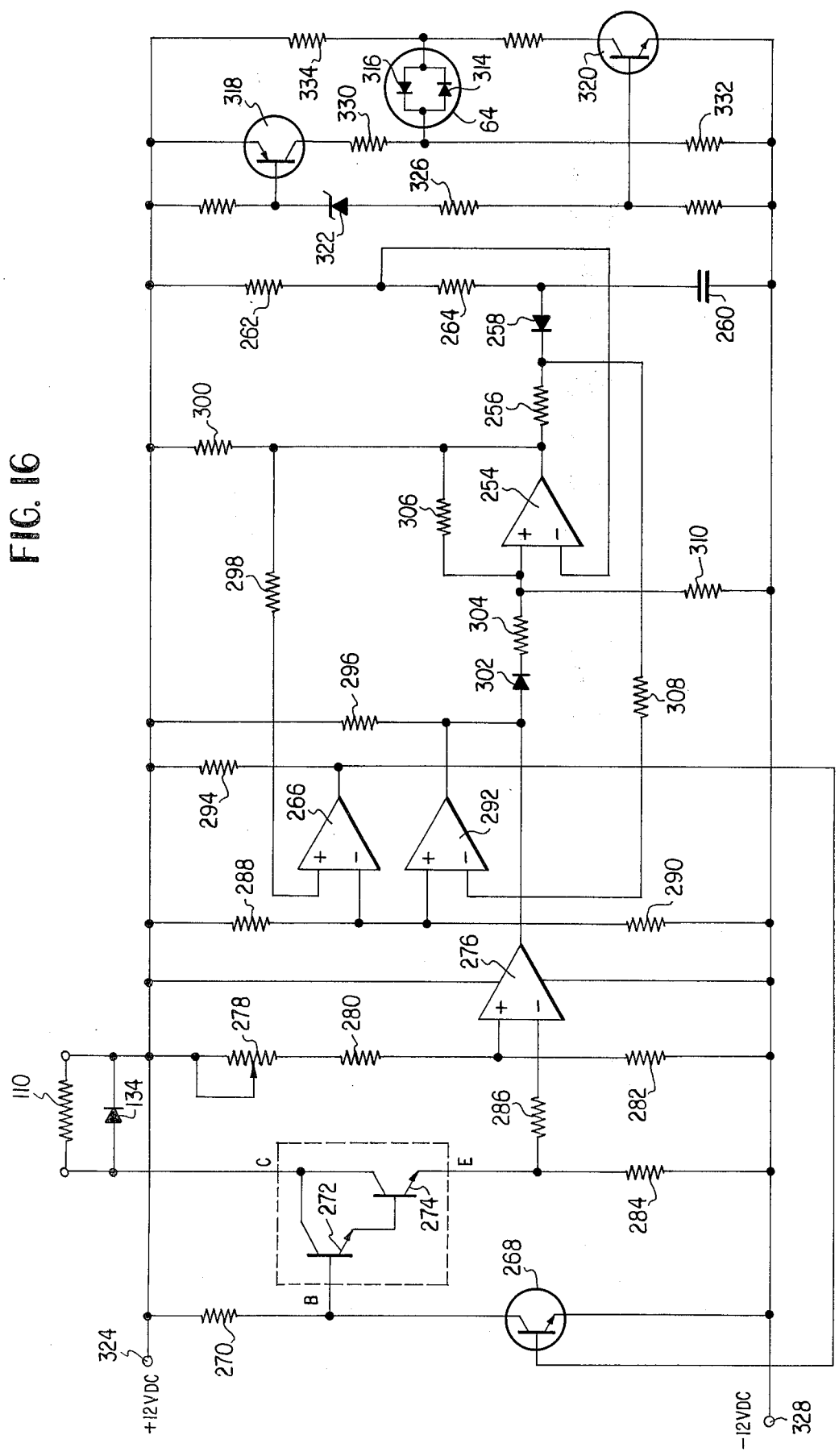
FIG. 16 is a schematic view diagram of an illustrative battery status/temperature controller circuitry for use with the system of FIG. 1.

Referring to FIG. 16, there is shown illustrative temperature control/battery status circuitry 14. The circuitry for controlling the heating current to and thus the temperature of heating element 110 of FIG. 3 is such that the heating current is supplied at a high rate when the heating element is below a selected temperature and at a very low rate when it is above the selected temperature. The material employed for heating element 110 has a positive temperature coefficient of resistance and typically varies from about 1 ohm when cold to about 4 ohms when the maximum temperature has been reached, although, of course, other resistance ranges may be utilized. Typically, the heater element material may be a nickel-iron alloy. The circuitry of FIG. 16 senses the change in resistance by sensing the change in current through the heating element to thereby control its temperature. A digital system as opposed to an analog system is employed to thereby lessen power consumption. Accordingly, pulsed power is continuously applied to element 110 to obtain samples of the heater temperature. The sampling is effected by an oscillator comprising a comparator 254, a 10 K resistor 256, a diode 258, a 0.027 microfarad capacitor 260 and a voltage divider comprising a 1 megohm resistor 262 and a 100 K resistor 264, it being understood the foregoing values are for purposes of illustration.

When heater 110 is raised to its selected temperature, comparator 254 turns off so that its output goes positive. This allows the capacitor to charge through resistors 262 and 264. As capacitor 260 charges positively, the inverting input of comparator 254 becomes more positive. When it becomes more positive than the non-inverting input, the output of comparator 254 goes to ground thereby discharging capacitor 260 through resistor 256 and diode 258, the discharge time being much faster than the charging time.

During the time capacitor 260 is discharging, the output of comparator 254 remains at ground. This causes the non-inverting input of a comparator 266 to be at ground while the inverting input thereof is fixed at typically about 4 volts. Accordingly, the output of comparator 266 is grounded. This, in turn, causes a transistor 268 to be cut off. Accordingly, current flowing through a 200 ohm resistor 270 no longer flows into the base of a transistor 272 where transistors 272 and 274 comprise a Darlington pair which supply current to heating element 110.

If the temperature is high enough so that the inverting input to a comparator 276 remains below the input setting at the non-inverting input thereof, the sampling of the heater temperature will last only until capacitor 260 is discharged. The input setting at the non-inverting input of comparator 276 may be controlled by a potentiometer 278 or it may be fixed by 27 K resistor 280 and 1 K resistor 282. If, as stated above, the temperature is high enough so that the inverting input to comparator 276 remains below the non-inverting input setting, the inverting input of comparator 254 will become negative and the output will go positive and capacitor 260 will again start charging positive through resistors 262 and 264. The diode 258 prevents positive charging through resistor 256 on the output of comparator 254.

If the temperature is low, the sampling current will be high due to the low resistance of heater element 110. Thus, the inverting input of comparator 276 will be more positive than the non-inverting input thereof and the output will be grounded. This will cause the non-inverting input of comparator 254 to be more negative and the output of comparator 254 will stay negative. Hence capacitor 260 will not charge positive as long as the inverting input of comparator 276 is more positive than the non-inverting input.

As the temperature of heating element 110 increases, its resistance increases and the current decreases. Eventually, the inverting input of comparator 276 will become negative with respect to the non-inverting input and the output will move positive. This will allow comparator 254 to switch so that its output will be positive and the capacitor will again charge positive. Also, comparator 266 will switch so that its output will become positive and turn on transistor 268 so that the power pair 272 and 274 are turned off and no current is supplied to heating element 110. After capacitor 260 is charged to thereby switch comparator 254, another sample will occur and the cycle is repeated.

As can be appreciated, the current through heating element 110 is not switched on and off until the current reaches the input setting established at the non-inverting input of comparator 276. Hence, LED 134 of FIGS. 3 and 16 are not switched on and off until the heating element has been raised to its operating temperature. Accordingly, the operator is notified when the desolderer is ready for use by the blinking on and off of LED 134. Although shown conveniently mounted on the handle of the desolderer in FIG. 3, LED 134 can also be mounted on the front panel of the portable power pack shown in FIG. 2A.

Other elements employed in the temperature controller circuitry of FIG. 16 are a 0.1 resistor 284, 2 K resistor 286, 200 K resistor 288, 100 K resistor 290, comparator 292, 10 K resistor 294, 10 K resistor 296, 100 K resistor 298, 10 K resistor 300, diode 302, 10 K resistor 304, 100 K resistor 306, 100 K resistor 308 and 200 K resistor 310, it again being understood the foregoing values are given for purposes of illustration.

The battery status circuitry of FIG. 16 employs a single bulb or package 64 (also see FIG. 2) containing two LEDs 314 and 316 which indicate whether the battery voltage is above (green LED 314 on, red LED 316 off) or below (red LED 316 on, green LED 314 off) a certain predetermined voltage. The predetermined voltage is determined by the base to emitter voltage (ON) of two transistors 318 and 320 plus the Zener knee voltage of a Zener diode 322. When the battery voltage is higher than the predetermined voltage, a current path is from the positive battery terminal 324 through the emitter-base junction of transistor 318, through Zener diode 322 and 180 ohm resistor 326 into the base of transistor 320 and out its emitter to negative battery terminal 328. Thus, transistors 318 and 320 saturate and a further current path is established between the emitter and collector of transistor 318, through 180 ohm resistor 330, green LED 314, and thence from the collector to the emitter of transistor 320. Hence, the green LED is lit to indicate the battery is above the predetermined voltage. There will also be some current which goes through 360 ohm resistor 332.

When the battery voltage is less than the predetermined voltage, which is basically established by Zener diode 322, the Zener diode switches off thereby turning transistors 318 and 320 off. Hence, current through green LED 314 is turned off. The current path from positive battery terminal 324 to the negative battery terminal is now through 360 ohm resistor 334, red LED 316 and resistor 332.

Figure 17:
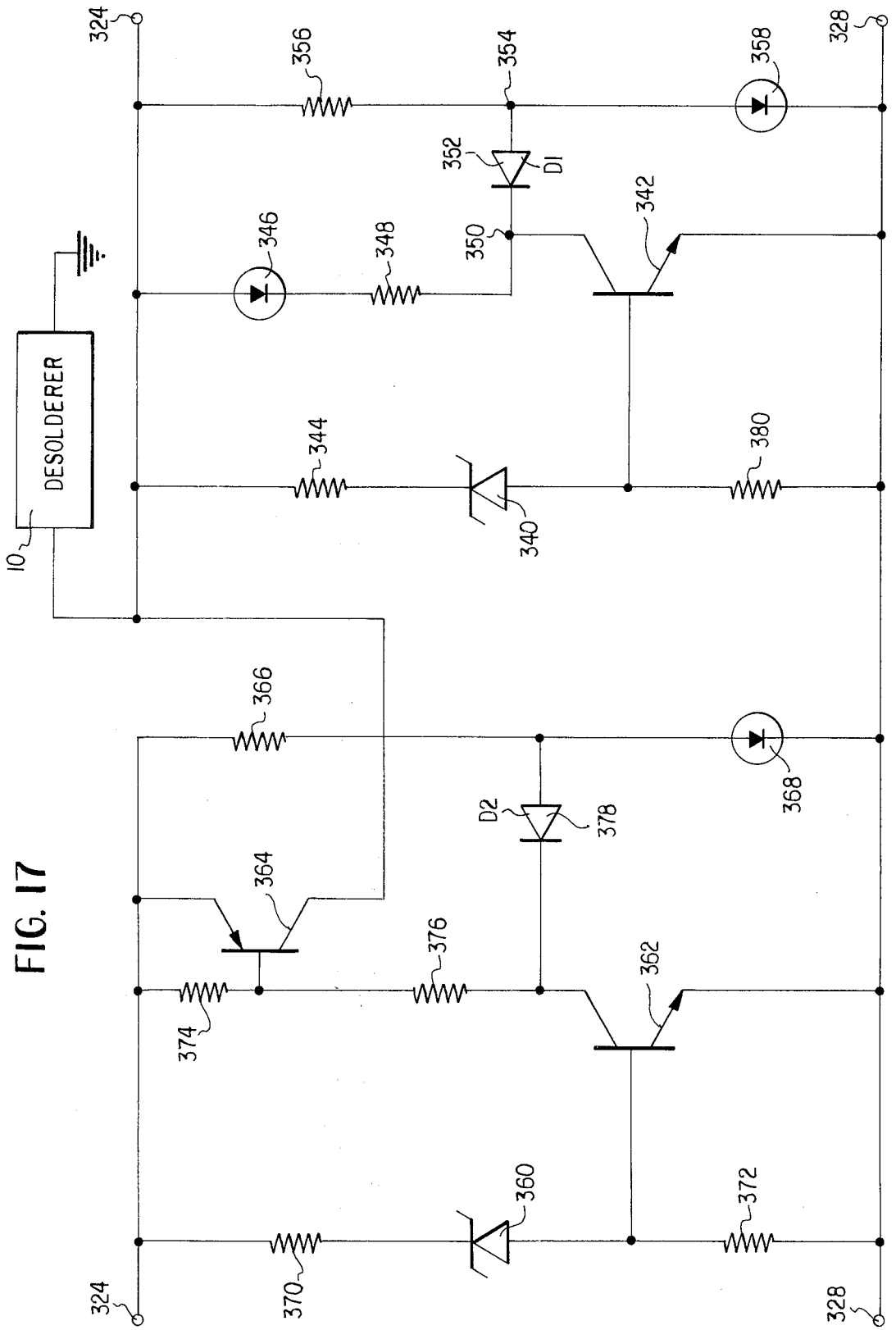
FIG. 17 is a schematic diagram of an illustrative, modified battery status indicating circuitry for use with the system of FIG. 1.

Alternatively, circuitry for indicating the status of the power source 12 is shown in FIG. 17. This circuitry not only provides indications of the power source status but it also turns off the current to desolderer 10 whenever the battery voltage falls below a predetermined level. In particular, a green light is lit if the battery is charged above a first predetermined voltage and is fully operational, an amber light is lit if the battery has discharged below the first predetermined voltage and if a predetermined number of ampere hours are left before a cut-off signal and a red light is lit if the battery has discharged below good operating level whereby power will be removed from desolderer 10 or whatever power utilization device is being employed.

In FIG. 17, Zener diode 340 determines the voltage which separates the green light condition from the amber light condition. In the amber light condition, the battery should be recharged but still may be used for a limited amount of time. The Zener diode 340 voltage is approximately about 10 volts. When the battery voltage is more than this voltage plus the base to emitter voltage of transistor 342, a current flows through 100 ohm resistor 344, Zener diode 340 and through the base emitter junction of transistor 342. Thus, a current path is established through saturated transistor 342 from positive battery terminal 324 through green LED 346, resistor 348 to the negative battery terminal 328. When the voltage of power source 12 is less than about 10.5 volts, the current through Zener diode 340 will substantially decrease thereby switching transistor 342 off. Point 350 will then go approximately to the battery voltage and green LED 346 will turn off. Diode 352 will allow point 354 to be determined by the current through resistor 356 and amber LED 358 so that LED 358 is now turned on.

Zener diode 360 should have its knee about 1 to 1½ volts below that of Zener diode 340. At any voltage above the Zener voltage plus the base to emitter junction voltage of transistor 362, transistor 362 will be turned on. Transistor 362 supplies base current for a transistor 364 which, in turn, controls the current through the heating element of desolderer 10. When the battery voltage drops below the Zener knee of diode 360, transistor 362 is cut off which, in turn, cuts off transistor 364 so that no further power can be drawn from the battery. Thus, the current path from positive battery terminal 324 is switched through resistor 366 and red LED 368.

The circuitry of FIG. 17 also includes 50 ohm resistor 370, 750 ohm resistor 372, 500 ohm resistor 374, 20 ohm resistor 376, diode 378 and 750 ohm resistor 380.

What is claimed is:

1. A portable electronics repair system comprising
   a portable container;
   a vacuum source disposed within said container;
   an electrical power source; and
   a desolderer responsive to said electrical power and vacuum source, said desolderer including
   a heating wire energized by said electrical power source;
   heating wire support means for supporting said heating wire;
   a tubular sleeve, said heating wire and the support therefor being disposed in the tubular sleeve;
   a tubular desoldering tip extending into said tubular sleeve, said desoldering tip being in communication with said vacuum source and being heated by said heating wire via the heating wire support means,
   a hollow handle, said tubular sleeve being mounted on the forward end of said handle;
   a tubular solder collection chamber disposed within said handle;
   a seal disposed between said solder collection chamber and said tubular sleeve to thereby establish a first sealing relationship between the tubular sleeve and the seal and a second sealing relationship between the solder collection chamber and the seal; and
   electrical connecting means adapted to connect said heating wire to a source of electrical energy, said electrical connecting means being sandwiched firmly between said seal and said tubular sleeve as it passes from the inside of said tubular sleeve to the outside of said solder collection chamber.

2. A system as in claim 1 where said seal engages said tubular sleeve and where said electrical connecting means includes at least one electrical contact disposed on said tubular sleeve at the point where said seal engages said tubular sleeve, said one electrical contact being connected to one end of said heating wire.

3. A system as in claim 2 where said electrical connecting means includes a further electrical contact disposed between said tubular sleeve and said seal, said further electrical contact extending to the space outside said solder collection chamber.

4. A system as in claims 1 or 2 where said heater wire support means is tubular and said desoldering tip extends into the tubular heater wire support means.

5. A system as in claim 4 where said tubular desoldering tip extends completely through the tubular heater wire support means.

6. A system as in claims 1 or 2 where the heat capacity of the heating wire support means is no more than about twice that of the desoldering tip.

7. A system as in claim 6 where the mass of said heating wire support means is no more than about twice that of the tubular desoldering tip.

8. A system as in claim 6 where the heat capacity of said heating wire support means is less than that of said tubular desoldering tip.

9. A system as in claim 8 where the mass of said heating wire support means is less than that of said tubular desoldering tip.

10. A system as in claim 1 where said tubular sleeve comprises a heat insulating material.

11. A system as in claims 1 or 2 where said electrical power source is a 12 volt battery.

12. A system as in claim 1 including electrical switching means mounted on said handle to connect and disconnect said heating means from said electrical power source.

13. A system as in claims 1 or 2 where heating wire support means is tubular and said desolderer includes
    forward spacer means disposed between said heating wire support means and said tubular sleeve at one end of said heating wire; and
    rearward spacer means disposed between said heating wire support means and said tubular sleeve at the other end of said heating wire to thereby form a substantially enclosed space for said heating wire defined by said tubular sleeve, said heating wire support means, and said forward and rearward spacer means.

14. A system as in claim 13 where said space completely encloses said heating wire.

15. A system as in claim 13 where said electrical connecting means includes at least two electrical contacts disposed on said tubular sleeve toward the rear portion thereof, said electrical contacts being respectively connected to said one end and said other end of the heating wire.

16. A system as in claim 15 where said electrical connecting means includes first and second electrical wires respectively connecting said two contacts to said one and other ends of the heating wire, the electrical wires passing between said tubular sleeve and said rearward spacer means.

17. A system as in claim 15 where said tubular sleeve includes at least one flange portion, said electrical contacts being disposed on said flange portion.

18. A system as in claim 13 where said heating wire is wound about said heating wire support means.

19. A system as in claim 13 where said heating wire support means includes a circular groove on the interior surface thereof, said groove being adapted to releasably hold a desoldering tip having a circumferential ridge in place within the heating wire support means.

20. A system as in claim 1 where the heat capacity of the heating wire support means and the desoldering tip are such that the time required for the entirety of the tip to reach a soldering melting temperature is no more than about five minutes.

21. A system as in claim 20 where said electrical power source is a 12 volt battery.

22. A system as in claim 20 where said time required for the desoldering tip to reach said solder melting temperature is no more than about 90 seconds.

23. A system as in claim 22 where said time is at least 30 seconds.

24. A portable electronics repair system comprising
a portable container;
a vacuum source disposed within said container;
an electrical power source; and
a desolderer responsive to said electrical power and vacuum sources, said desolderer including
a heating wire energized by said electrical power source;
a tubular heating wire support means for supporting said heating wire;
a tubular sleeve, said heating wire and the support therefor being disposed in the tubular sleeve;
a tubular desoldering tip extending into said tubular sleeve, said desoldering tip being in communication with said vacuum source and being heated by said heating wire via the heating wire support means,
a hollow handle, said tubular sleeve being mounted on the forward end of said handle;
a tubular solder collection chamber disposed within said handle;
a seal disposed between said solder collection chamber and said tubular sleeve;
electrical connecting means adapted to connect said heating wire to a source of electrical energy, said electrical connecting means being in contact with one side of said seal as it passes from the inside of said tubular sleeve to the outside of said solder collection chamber where said electrical connecting means includes at least two electrical contacts disposed on said tubular sleeve toward the rear portion thereof, said electrical contacts being respectively connected to said one end and said other end of the heating wire;
forward spacer means disposed between said heating wire support means and said tubular sleeve at one end of said heating wire; and
rearward spacer means disposed between said heating wire support means and said tubular sleeve at the other end of said heating wire to thereby form a substantially enclosed space for said heating wire defined by said tubular sleeve, said heating wire support means, and said forward and rearward spacer means.

25. A system as in claims 1 or 2 where said desoldering tip includes a circumferential protuberance and said heating wire support means includes a circumferential groove provided on an internal surface thereof for receiving said circumferential protuberance of the desoldering tip so that said tip may be removably positioned with respect to the tubular sleeve.

26. A system as in claim 25 where said groove in the heating wire support means comprises a counterbore in the forward edge thereof.

27. A system as in claim 25 where said groove is removed from the forward edge of said heating wire support means.

28. A system as in claim 27 where said heating wire support means includes at least one longitudinal slot extending from the forward edge thereof to permit said desoldering tip with its protuberance to be inserted into said support means.

29. A system as in claim 28 where said hollow handle and solder collection chamber are disposed within said handle in air-tight communication with said desoldering tip, said protuberance assisting to seal vacuum.

30. A system as in claim 25 where said electrical power source is a 12 volt battery.

31. A system as in claims 1 or 2 including a plurality of circumferentially disposed ribs depending from the inner surface of said handle to guide and support said solder collection chamber as it is passed through said handle into engagement with said seal.

32. A system as in claims 1 or 2 including a helical baffle mounted within said solder collection chamber, said baffle being in contact with the internal surface of said chamber so that removal of the baffle from the chamber with a twisting motion will scrape away solder solidified on the internal surface.

33. A system as in claims 1 or 2 where said seal is annular and planar and where said solder collection chamber engages the side of said seal opposite said one side.

34. A system as in claim 33 including spring biasing means for biasing said solder collection chamber toward said opposite side of the seal.

35. A desolderer comprising
a tubular sleeve;
a heating wire disposed within said sleeve;
a hollow handle, said tubular sleeve being mounted on the forward end of said handle;
a tubular solder collection chamber disposed within said handle and adapted for connection to a vacuum source;
a tubular desoldering tip heated by said heating wire and communicating with said tubular solder collection chamber through said tubular sleeve to thereby facilitate the passage of molten solder from the tip to the collection chamber;

a seal disposed between said solder collection chamber and said tubular sleeve; and electrical connecting means adapted to connect said heating wire to a source of electrical energy, said electrical connecting means being in contact with one side of said seal as the electrical connecting means extends from the inside of said tubular sleeve to the outside of said solder collection chamber where said seal engages said tubular sleeve and where said electrical connecting means includes at least one electrical contact disposed on said tubular sleeve at the point where said seal engages said tubular sleeve, said one electrical contact being connected to one end of said heating wire.

36. A heater assembly for a desolderer having a tubular tip adapted for contacting a termination to be desoldered, a solder collection chamber and sealing means for vacuum sealing the forward end of said solder collection chamber, said heater assembly comprising:

a tubular sleeve;

a heating element disposed within said sleeve for heating said tip to a solder melting temperature; and electrical connecting means adapted to connect said heating element to a source of electrical energy, said electrical connecting means further being adapted for contact with one side of said sealing means as the electrical connecting means extends from inside the tubular sleeve to outside the solder collection chamber where said electrical connecting means includes at least one electrical contact disposed on said tubular sleeve adapted for contact with said seal, said one electrical contact being connected to one end of said heating element.

37. A desolderer comprising
a tubular sleeve;
a heating element disposed within said sleeve;
a hollow handle, said tubular sleeve being mounted on the forward end of said handle;
a tubular solder collection chamber disposed within said handle and adapted for connection to a vacuum source;
a tubular desoldering tip heated by said heating element and communicating with said tubular solder collection chamber through said tubular sleeve to thereby facilitate the passage of molten solder from the tip to the collection chamber;
a seal for establishing air-tight communication of said solder collection chamber with said desoldering tip where said seal is annular and planar and where said solder collection chamber engages one side of said seal;
spring biasing means for biasing said solder collection chamber toward said seal;
electrical connecting means adapted to connect said heating element to a source of electrical energy, a portion of said electrical connecting means being in contact with the side of said seal opposite said one side as the electrical connecting means extends from inside the tubular sleeve to outside the solder collection chamber.

38. A desolderer comprising
a tubular sleeve;
a heating wire disposed within said sleeve;
a hollow handle, said tubular sleeve being mounted on the forward end of said handle;
a tubular solder collection chamber disposed within said handle and adapted for connection to a vacuum source;
a tubular desoldering tip heated by said heating wire and communicating with said tubular solder collection chamber through said tubular sleeve to thereby facilitate the passage of molten solder from the tip to the collection chamber;
a seal disposed between said solder collection chamber and said tubular sleeve to thereby establish a first sealing relationship between the tubular sleeve and the seal and a second sealing relationship between the solder collection chamber and the seal; and
electrical connecting means adapted to connect said heating wire to a source of electrical energy, said electrical connecting means being sandwiched firmly between said seal and said tubular sleeve as the electrical connecting means extends from the inside of said tubular sleeve to the outside of said solder collection chamber.

39. A desolderer as in claim 38 where said seal engages said tubular sleeve and where said electrical connecting means includes at least one electrical contact disposed on said tubular sleeve at the point where said seal engages said tubular sleeve, said one electrical contact being connected to one end of said heating wire.

40. A desolderer as in claim 39 where said electrical connecting means includes a further electrical contact disposed between said tubular sleeve and said seal, said further electrical contact extending to the space outside said solder collection chamber.

41. A desolder as in claim 38 including a tubular heating wire support means for supporting said heating wire where said tubular desoldering tip includes a circumferential protuberance and said heating wire support means includes a circumferential groove provided on an internal surface therefor for receiving said circumferential protuberance of the desoldering tip so that said tip may be removably positioned with respect to the tubular sleeve.

42. A desolderer as in claim 41 where said groove in the heating wire support means comprises a counterbore in the forward edge of said tubular sleeve.

43. A desolderer as in claim 41 where said groove is removed from the forward edge of said heating wire support means.

44. A desolderer as in claim 43 where said heating wire support means has at least one longitudinal slot extending from the forward edge thereof to permit said desoldering tip with its protuberance to be inserted into said support means.

45. A desolderer as in claim 41 where said handle is hollow and said solder collection chamber is disposed within said handle, said protuberance further acting as a seal between the tip and the heating wire support means.

46. A desolderer as in claim 38 where said seal is annular and planar and where said solder collection chamber engages the side of said seal opposite said one side.

47. A desolderer as in claim 46 including spring biasing means for biasing said solder collection chamber toward said opposite side of the seal.

48. A heater assembly for a desolderer having a tubular tip adapted for contacting a termination to be desoldered, a solder collection chamber and sealing means for vacuum sealing the forward end of said solder collection chamber, said heater assembly comprising:
- a tubular sleeve, said sealing means adapted to establish a sealing relationship between the tubular sleeve and the sealing means;
- a heating element disposed within said sleeve for heating said tip to a solder melting temperature; and
- electrical connecting means adapted to connect said heating element to a source of electrical energy, said electrical connecting means further being adapted for sandwiching between said sealing means and said tubular sleeve as the electrical connecting means extends from inside the tubular sleeve to outside the solder collection chamber, said electrical connecting means including at least one electrical contact disposed on said tubular sleeve adapted for contact with said seal, said one electrical contact being connected to one end of said heating element.

* * * * *